(12) United States Patent
Park

(10) Patent No.: US 9,356,200 B2
(45) Date of Patent: May 31, 2016

(54) LIGHT EMITTING DEVICE PACKAGE

(71) Applicant: LG INNOTEK CO., LTD., Seoul (KR)

(72) Inventor: Hae Jin Park, Seoul (KR)

(73) Assignee: LG INNTOTEK CO., LTD., Seoul (KR)

( * ) Notice: Subject to any disclaimer, the term of this patent is extended or adjusted under 35 U.S.C. 154(b) by 0 days.

(21) Appl. No.: 14/213,562

(22) Filed: Mar. 14, 2014

(65) Prior Publication Data

US 2015/0001573 A1    Jan. 1, 2015

(30) Foreign Application Priority Data

Jun. 27, 2013  (KR) .................. 10-2013-0074209

(51) Int. Cl.
| | |
|---|---|
| *H01L 33/48* | (2010.01) |
| *H01L 33/62* | (2010.01) |
| *H01L 33/54* | (2010.01) |

(52) U.S. Cl.
CPC ............ *H01L 33/483* (2013.01); *H01L 33/486* (2013.01); *H01L 33/62* (2013.01); *H01L 33/54* (2013.01); *H01L 2224/06102* (2013.01); *H01L 2224/1703* (2013.01); *H01L 2224/48091* (2013.01); *H01L 2933/005* (2013.01)

(58) Field of Classification Search
CPC ....... H01L 33/52; H01L 33/54; H01L 33/483; H01L 33/486; H01L 33/58; H01L 33/62
See application file for complete search history.

(56) References Cited

U.S. PATENT DOCUMENTS

| | | | | |
|---|---|---|---|---|
| 8,575,646 | B1* | 11/2013 | Shum | 257/100 |
| 2006/0097385 | A1* | 5/2006 | Negley | 257/722 |
| 2007/0237197 | A1* | 10/2007 | Chikugawa | 372/36 |
| 2008/0029775 | A1 | 2/2008 | Liu et al. | 257/98 |
| 2008/0035948 | A1 | 2/2008 | Shin et al. | 257/99 |
| 2009/0152691 | A1 | 6/2009 | Nguyen et al. | 257/667 |
| 2012/0061835 | A1* | 3/2012 | Hosseini et al. | 257/739 |
| 2012/0139003 | A1 | 6/2012 | Zitzlsperger et al. | 257/99 |
| 2014/0124812 | A1* | 5/2014 | Kuramoto et al. | 257/98 |
| 2014/0354145 | A1* | 12/2014 | Fisher et al. | 313/512 |

FOREIGN PATENT DOCUMENTS

| | | |
|---|---|---|
| DE | 10 2009 031 008 A1 | 12/2010 |
| JP | 2006-080141 A | 3/2006 |

OTHER PUBLICATIONS

European Search Report date Nov. 5, 2014 issued in Application No. 14 171 869.2.

\* cited by examiner

*Primary Examiner* — Yu Chen
(74) *Attorney, Agent, or Firm* — Ked & Associates, LLP

(57) ABSTRACT

Disclosed is a light emitting device package including a package body having at least one cavity, at least one light emitting device mounted on the cavity, and a molding member disposed on the light emitting device to fill the cavity. The package body has at least one first recess formed at an upper portion than a bottom surface of the cavity, and the molding member is disposed to an inner edge of the at least one first recess.

14 Claims, 13 Drawing Sheets

PRIOR ART        FIG. 8A

LIGHT EMITTING DEVICE PACKAGE

CROSS REFERENCE TO RELATED APPLICATION

This application claims priority under 35 U.S.C. §119 to Korean Patent Application No. 10-2013-0074209 filed in Korea on Jun. 27, 2013, which is hereby incorporated in its entirety by reference as if fully set forth herein.

TECHNICAL FIELD

Embodiments relate to a light emitting device package.

BACKGROUND

A light emitting diode (LED) is a semiconductor device that transmits and receives signals by converting electrical signals into infrared light or visible light using properties of compound semiconductors and is widely used as a light source.

Group III-V nitride semiconductor materials are recently receiving attention as main materials of light emitting devices such as LEDs and laser diodes (LDs) due to physical and chemical properties thereof.

Such LEDs are eco-friendly, since hazardous substances, such as mercury (Hg) used in conventional lighting apparatuses such as incandescent lamps and fluorescent lamps, are not used therein, and have long lifespan and low power consumption. Thus, LEDs are replacing conventional light sources.

FIG. 1 is a cross-sectional view illustrating a conventional light emitting device package.

The light emitting device package illustrated in FIG. 1 consists of package bodies 10A and 10B electrically separated from each other by an insulating material 20, a light emitting device 30, a submount 40, wires 50A and 50B, and a molding member 60.

When the light emitting device 30 of FIG. 1 emits deep ultraviolet (DUV) light, the molding member 60 has a very low viscosity. For example, when the light emitting device 30 emits blue light, the molding member 60 has a viscosity greater than 20 Pa·sec. When the light emitting device 30 emits DUV light, the molding member 60 has a very low viscosity of 3.2 Pa·sec. Accordingly, the molding member 60 may be formed in a flat dome shape, resulting in decreased light extraction efficiency.

In addition, due to differences in thermal expansion coefficient between the submount 40 and the package bodies 10A and 10B formed of aluminum (Al), contact properties therebetween may be deteriorated, thereby reducing product reliability.

In addition, low reliability of bonding between the package bodies 10A and 10B formed of aluminum (Al) and the wires 50A and 50B formed of gold (Au) may cause product defects.

SUMMARY

Embodiments provide a light emitting device package having improved light extraction efficiency.

In one embodiment, a light emitting device package may include a package body having at least one cavity, at least one light emitting device mounted on the cavity, and a molding member disposed on the light emitting device to fill the cavity. The package body may have at least one first recess formed at an upper portion than a bottom surface of the cavity, and the molding member may be disposed to an inner edge of the at least one first recess.

A planar shape of the first recess may be the same as a planar shape of the cavity.

The at least one first recess may be disposed to be adjacent to a side end of the cavity.

The at least one first recess may have a circular planar shape surrounding the cavity.

The light emitting device may emit light having a wavelength ranging from 200 nm to 405 nm.

A first viscosity of the molding member used when the light emitting device emits UV light may be lower than a second viscosity of the molding member used when the light emitting device emits blue light.

The light emitting device package may further include a coating layer disposed between the molding member and the package body on at least one portion of a region between one edge of the cavity and the inner edge of the first recess.

The coating layer may include a material having a low interfacial energy with the molding member. The coating layer may include an oxide or polymer.

The light emitting device package may further include a submount disposed between the light emitting device and the package body.

The package body may further include at least one second recess disposed to contact the submount.

The at least one second recess may have a greater width than a short-axis width of the submount and include a plurality of second recesses aligned in a long-axis direction of the submount.

The at least one second recess may have a depth satisfying the following formula.

$$t<d<5t$$

Here, d is a depth of the at least one second recess and t is an interval between the plurality of second recesses.

The at least one second recess may include a plurality of second recesses having the same length and width or different lengths and widths.

At least one inner portion of the at least one second recess may be filled with air.

At least one inner portion of the at least one second recess may be filled with the molding member.

The light emitting device package may further include a wire electrically connecting the package body and the light emitting device. Here, the package body may have a wire bonding region, to which the wire is bonded, having a rough surface.

The wire bonding region may have an average surface roughness ranging of greater than 1.6 μm and less than 25 μm.

The package body may include aluminum (Al), and the wire include gold (Au).

In another embodiment, a light emitting device package may include a package body having at least one cavity, at least one light emitting device mounted on the cavity, and a molding member disposed on the light emitting device to fill the cavity. The package body may have a molding holding unit disposed on an upper portion than a bottom surface of the cavity and disposed to be adjacent to an edge of the molding member.

The molding holding unit may have at least one first recess.

The molding member may be disposed to an inner edge of the at least one first recess.

The molding member may be disposed to an outer edge of the at least one first recess while filling the at least one first recess.

BRIEF DESCRIPTION OF THE DRAWINGS

Arrangements and embodiments will be described in detail with reference to the following drawings in which like reference numerals refer to like elements and wherein:

FIGS. 8A and 8B are photographs of cross-sections of a conventional light emitting device package and a light emitting device package according to an embodiment of the present disclosure;

DESCRIPTION OF SPECIFIC EMBODIMENTS

Figure 1:
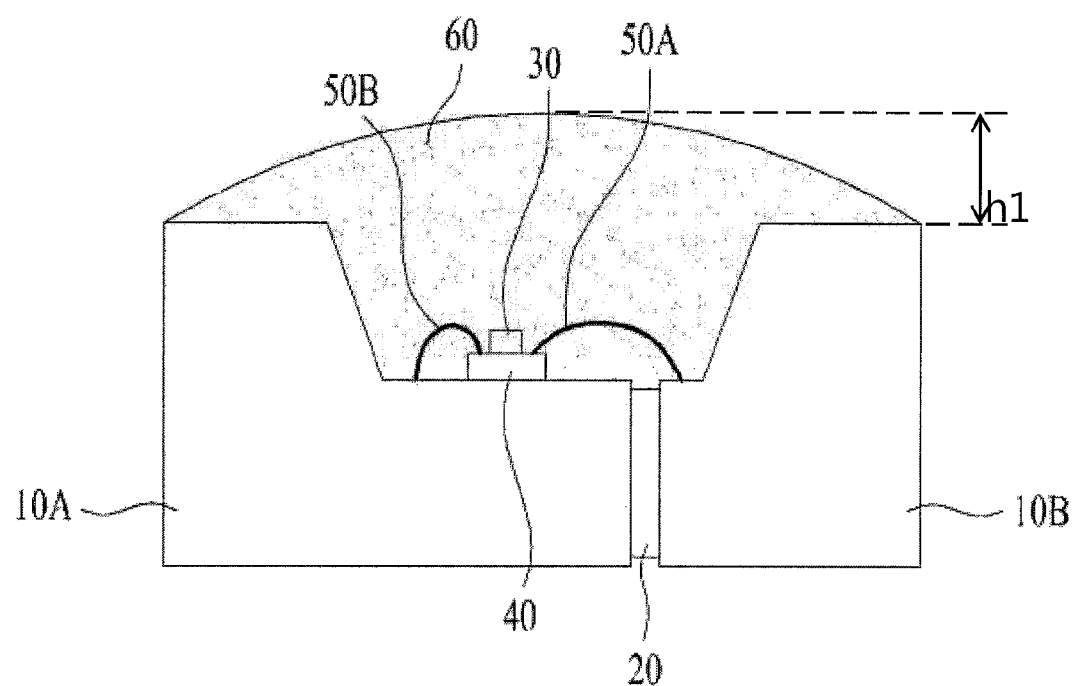
FIG. 1 is a cross-sectional view illustrating a conventional light emitting device package.

Hereinafter, embodiments will be described with reference to the annexed drawings. However, embodiments as described below can be modified in various forms, and the scope of the present disclosure is not limited to the embodiments. The embodiments of the present disclosure are provided to fully describe the present disclosure to those of ordinary skilled in the art.

It will be understood that when an element is referred to as being "on" or "under" another element, it can be directly on or under the element, and one or more intervening elements may also be present. When an element is referred to as being "on" or "under", under the element as well as on the element can be included based on the element.

Also, spatially relative terms, such as "first" or "second" and "upper" or "lower", may be used herein for ease of description to describe the relationship of one element or feature to another element(s) or feature(s) without necessarily requiring or including the physical or logical relationship therebetween or the order thereof.

In the drawings, the thickness or size of each layer is exaggerated, omitted, or schematically illustrated for convenience of description and clarity. In addition, the size or area of each constituent element does not entirely reflect the actual size thereof.

Figure 2:
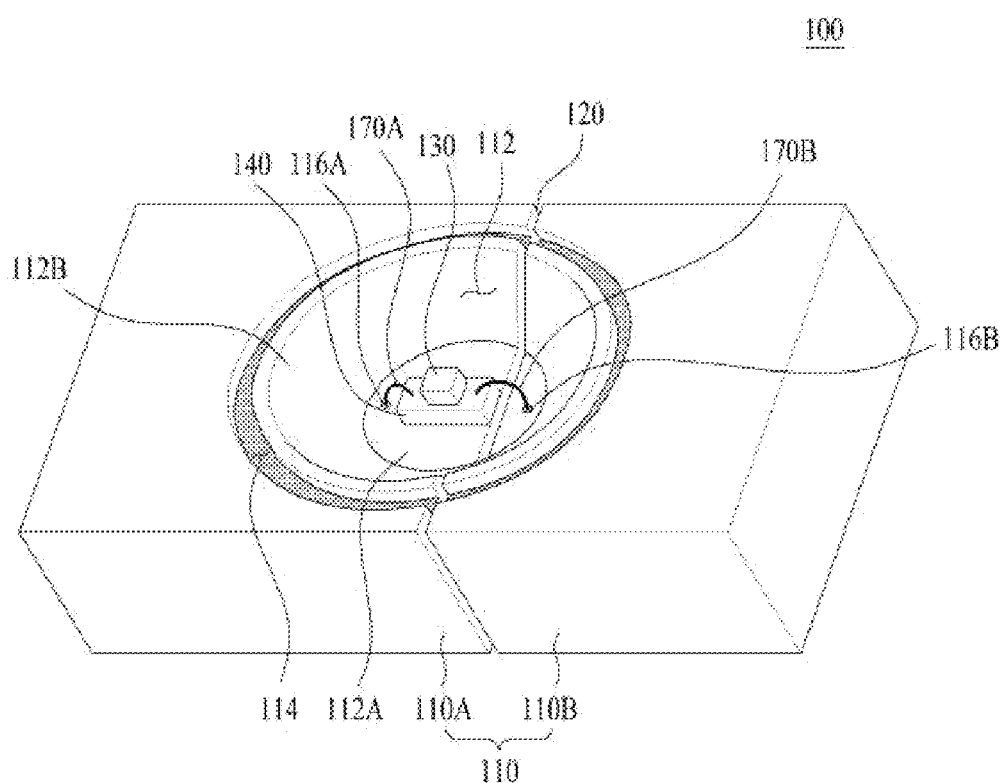
FIG. 2 is a perspective view illustrating a light emitting device package according to an embodiment of the present disclosure.
Figure 3:
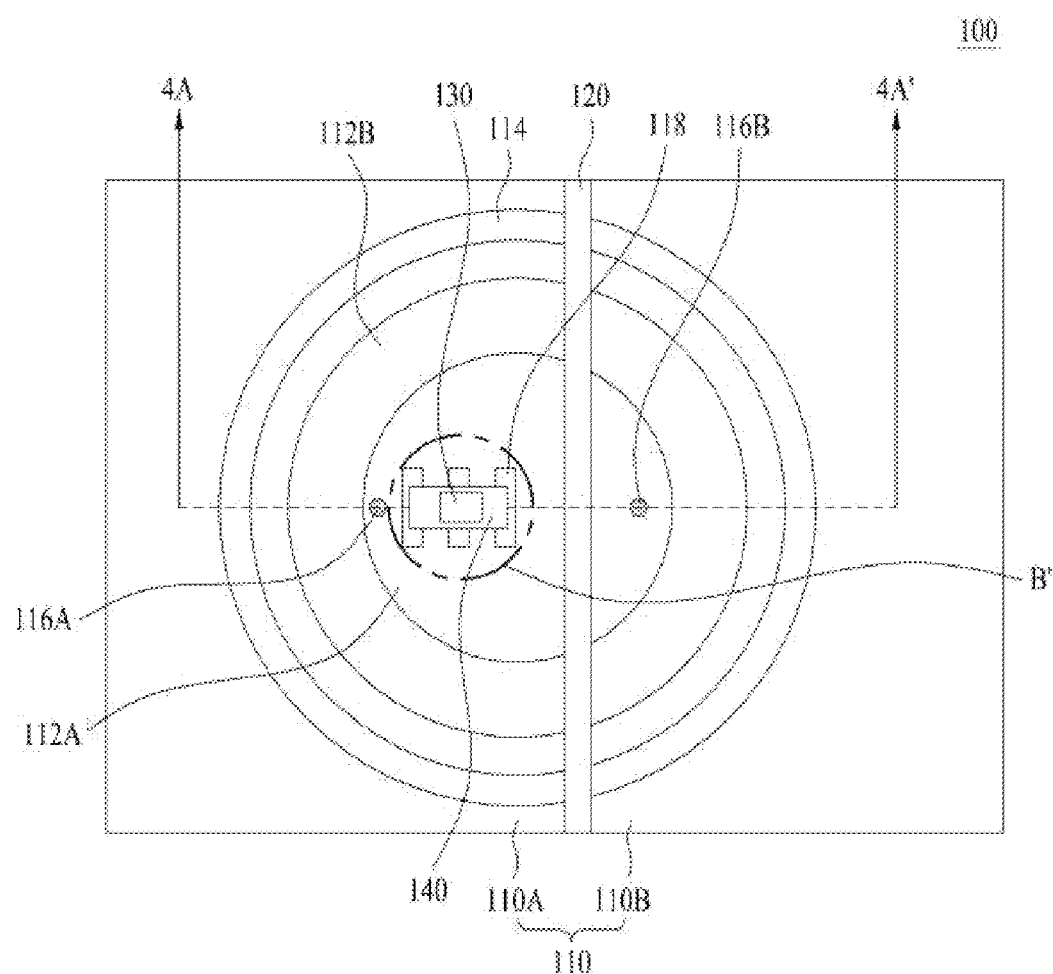
FIG. 3 is a plan view illustrating the light emitting device package of FIG. 2.
Figure 4:
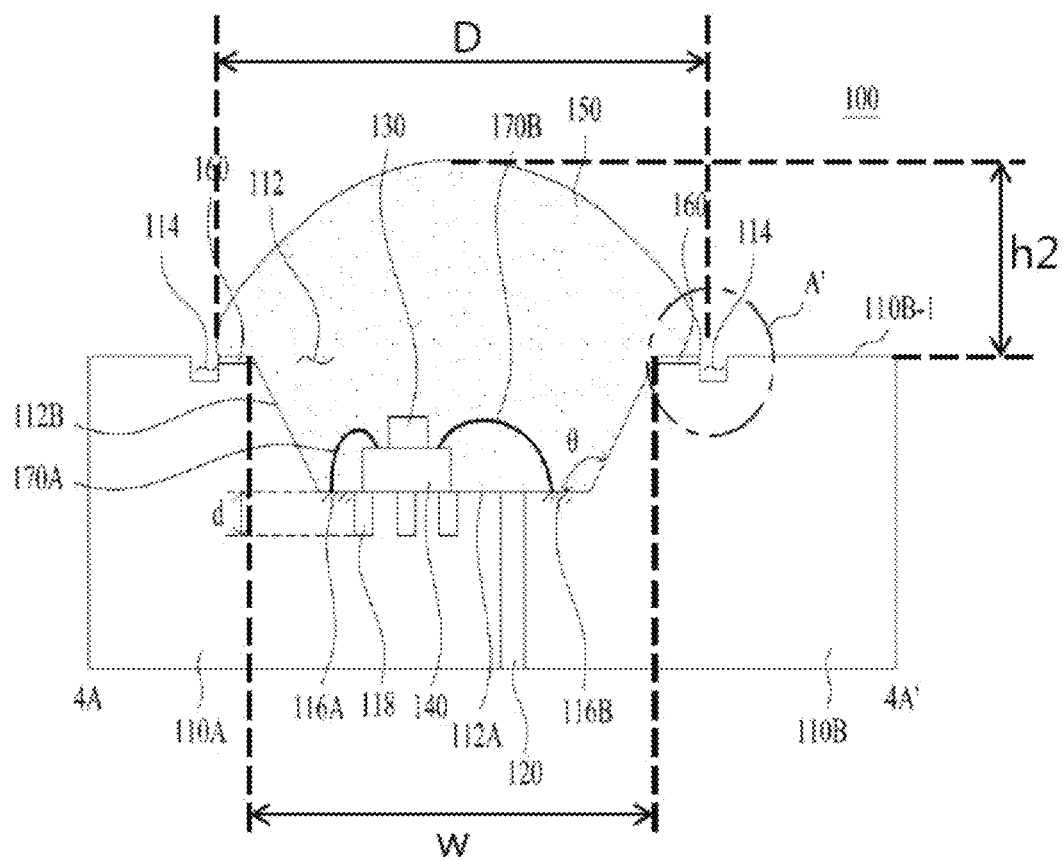
FIG. 4 is a cross-sectional view taken along line 4A-4A' of FIG. 3.

FIG. 2 is a perspective view illustrating a light emitting device package 100 according to an embodiment of the present disclosure. FIG. 3 is a plan view illustrating the light emitting device package 100 of FIG. 2. FIG. 4 is a cross-sectional view taken along line 4A-4A' of FIG. 3. For convenience of description, a molding member 150 is not illustrated in FIGS. 2 and 3.

The light emitting device package 100 according to the illustrated embodiment includes a package body 110, an insulating unit 120, a light emitting device 130, a submount 140, a molding member 150, a coating layer 160, and wires 170A and 170B.

The package body 110 includes a first body 110A and a second body 110B, which are electrically separated from each other by the insulating unit 120. The package body 110 may include a metal. When the light emitting device (or, light emitting device chip) 130 emits deep ultraviolet (DUV) light, aluminum (Al) may be used to form the package body 110 to improve reflectivity and heat dissipation.

In addition, the first and second bodies 110A and 110B of the package body 110 have at least one cavity 112. Here, the cavity 112 may have a cup-shaped cross-section. Referring to FIG. 4, an angle (θ) between a lower surface 112A and a side surface 112B of the cavity 112 may be in the range of 30° to 60°.

Referring to FIGS. 2 to 4, the light emitting device 130 and the submount 140 are mounted on the first body 110A of the package body 110, but the illustrated embodiment is not limited thereto. Namely, according to another embodiment, the light emitting device 130 and the submount 140 may be disposed on the second body 110B of the package body 110, differently from the structure illustrated in FIGS. 2 to 4.

Hereinafter, as illustrated in FIGS. 2 to 4, the light emitting device 130 is connected to the package body 110 through the submount 140 by flip chip bonding. However, the illustrated embodiment is not limited thereto. Namely, according to another embodiment, the light emitting device 130 may be horizontally or vertically connected to the package body 110. In this case, the light emitting device 130 is mounted on the package body 110 in the cavity 112 without interposing the submount 140. For example, the light emitting device 130 may be directly mounted on the lower surface 112A of the cavity 112.

The light emitting device 130 is disposed on the submount 140, and the submount 140 is mounted on the package body 110 at the lower surface 112A of the cavity 112. Namely, the submount 140 is disposed between the light emitting device 130 and the first body 110A.

The light emitting device 130 may include an LED using a plurality of compound semiconductor layers, such as Group III-V compound semiconductor layers, and the LED may be a color LED emitting light such as blue light, green light, or red light, an ultraviolet (UV) LED, a deep ultraviolet (DUV) LED, or a non-polar LED. Light emitted from the LED may be implemented using a variety of semiconductors, but is not limited thereto.

Figure 5:
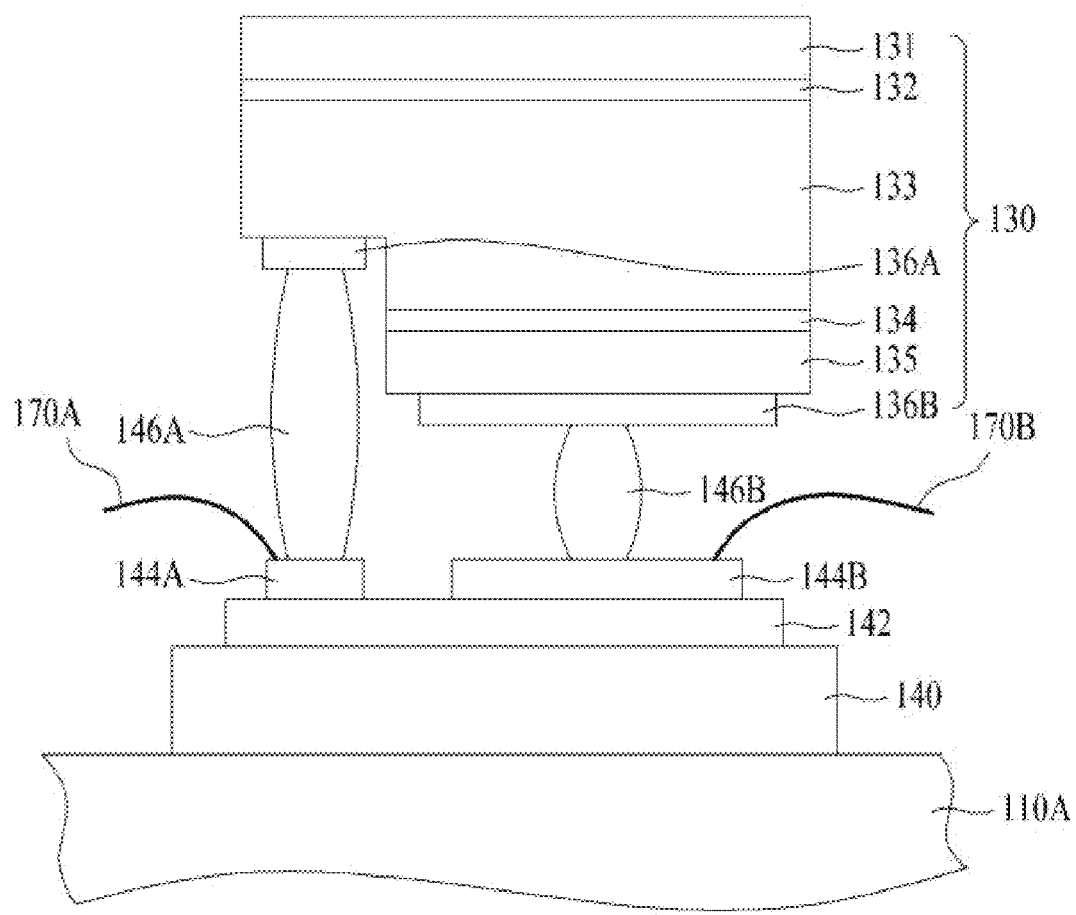
FIG. 5 is a cross-sectional view exemplarily illustrating a connection structure of a light emitting device and a submount illustrated in FIGS. 2 to 4.

FIG. 5 is a cross-sectional view exemplarily illustrating a connection structure of the light emitting device 130 and the submount 140 illustrated in FIGS. 2 to 4.

The light emitting device 130 includes a substrate 131, a buffer layer 132, a light emitting structure 133, 134, and 135, and first and second electrodes 136A and 136B.

The substrate 131 may have light transmittance such that light emitted from an active layer 134 is emitted through the substrate 131. For example, the substrate 131 may include at least one selected from the group consisting of sapphire ($Al_2O_3$), SiC, GaAs, GaN, ZnO, Si, GaP, InP, and Ge, without being limited thereto. In addition, the substrate 131 may have mechanical strength suitable for splitting into separate chips through a scribing process and a breaking process without causing bowing in the overall structure of nitride semiconductor.

The buffer layer 132 is disposed between the substrate 131 and the light emitting structure to improve lattice matching between the substrate 131 and the light emitting structure 133, 134, and 135. For example, the buffer layer 132 may include AlN or an undoped nitride, but is not limited thereto. The buffer layer 132 may be dispensed with according to the type of the substrate 131 and the type of the light emitting structure.

The light emitting structure is disposed under the buffer layer 132 and includes a first conductive semiconductor layer 133, the active layer 134, and a second conductive semiconductor layer 135, which are sequentially stacked.

The first conductive semiconductor layer 133 may be disposed between the buffer layer 132 and the active layer 134 and may be formed of a compound semiconductor material, for example, Group III-V and Group II-VI compound semiconductor materials. The first conductive semiconductor layer 133 may be doped with a first conductive dopant. For example, the first conductive semiconductor layer 133 may be formed of a semiconductor material having a formula represented by $Al_xIn_yGa_{(1-x-y)}N$ ($0 \le x \le 1$, $0 \le y \le 1$, and $0 \le x+y \le 1$) and may include at least one selected from the group consisting of InAlGaN, AlGaAs, GaP, GaAs, GaAsP, and AlGaInP. When the first conductive semiconductor layer 133 includes an n-type semiconductor, the first conductive dopant may include an n-type dopant such as Si, Ge, Sn, Se, and Te. The first conductive semiconductor layer 133 may have a single layer or a multilayer structure, without being limited thereto. When the light emitting device 130 illustrated in FIG. 5 is a light emitting device emitting UV light, especially DUV light, or a non-polar light emitting device, the first conductive semiconductor layer 133 may include at least one of InAlGaN or AlGaN.

The active layer 134 is disposed between the first conductive semiconductor layer 133 and the second conductive semiconductor layer 135 and may have a structure selected from the group consisting of a single well structure, a multi well structure, a single quantum well structure, a multi quantum well (MQW) structure, a quantum dot structure, or a quantum wire structure. The active layer 134 may have at least one layer pair structure including a well layer and a barrier layer using a Group III-V compound semiconductor materials selected from the group consisting of InGaN/GaN, InGaN/InGaN, GaN/AlGaN, InAlGaN/GaN, GaAs(InGaAs)/AlGaAs, GaP(InGaP)/AlGaP and combinations thereof, without being limited thereto. The well layer may be formed of a material with an energy band gap lower than that of the barrier layer. Particularly, the active layer 134 according to the illustrated embodiment may generate UV light, especially DUV light.

The second conductive semiconductor layer 135 may be disposed under the active layer 134. The second conductive semiconductor layer 135 may be formed of a compound semiconductor material. The second conductive semiconductor layer 135 may be implemented using Group III-V compound semiconductor materials or Group II-VI compound semiconductor materials and may be doped with a second conductive dopant. For example, the second conductive semiconductor layer 135 may be formed of a semiconductor material having a formula of $In_xAl_yGa_{1-x-y}N$ ($0 \le x \le 1$, $0 \le y \le 1$, and $0 \le x+y \le 1$) or at least one selected from the group consisting of AlInN, AlGaAs, GaP, GaAs, GaAsP, and AlGaInP. When the second conductive semiconductor layer 135 is a p-type semiconductor, the second conductive dopant may be a p-type dopant such as Mg, Zn, Ca, Sr, and Ba. The second conductive semiconductor layer 135 may have a single layer structure or a multilayer structure, without being limited thereto. If the light emitting device 130 is a light emitting device emitting UV light, especially DUV light, or a non-polar light emitting device, the second conductive semiconductor layer 135 may include at least one of InAlGaN or AlGaN.

Then, the first electrode 136A is disposed under the first conductive semiconductor layer 133. The first electrode 136A may include at least one of AlN or BN, without being limited thereto. Namely, any material capable of reflecting or transmitting light emitted from the active layer 134 without absorbing the light and capable of growing on the first conductive semiconductor layer 133 with high quality may be used to form the first electrode 136A.

In addition, the first electrode 136A may include a material having ohmic contact characteristics so that a separate ohmic layer (not shown) is not required. Alternatively, a separate ohmic layer may be disposed on the first electrode 136A.

In addition, the second electrode 136B may contact the second conductive semiconductor layer 135 and may be formed of a metal. For example, the second electrode 136B may be formed of Ag, Ni, Al, Rh, Pd, Ir, Ru, Mg, Zn, Pt, Au, or Hf or any combination thereof.

The second electrode 136B may be a transparent conductive oxide (TCO) film. For example, the second electrode 136B may include the aforementioned metallic material and at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, $RuO_x$/ITO, Ni/$IrO_x$/Au, and Ni/$IrO_x$/Au/ITO, without being limited thereto. The second electrode 136B may include a material having ohmic contact with the second conductive semiconductor layer 135.

In addition, the second electrode 136B may have a single layer or a multilayer structure formed of a material used to form a reflective electrode and having ohmic characteristics. When the second electrode 136 has ohmic characteristics, a separate ohmic layer (not shown) may not be formed.

Meanwhile, as illustrated in FIG. 5, the light emitting device package 100 may further include a passivation layer 142 disposed between the light emitting device 130 and the submount 140, first and second electrode pads 144A and 144B, and first and second bumps 146A and 146B.

The first and second electrodes 136A and 136B of the light emitting device 130 having a flip-bonding structure is mounted on the submount 140 by flip chip bonding as illustrated in FIG. 5.

The submount 140 may be a semiconductor substrate formed of, for example, AlN, BN, silicon carbide (SiC), GaN, GaAs, or Si. However, the illustrated embodiment is not limited thereto and any semiconductor material having excellent thermal conductivity may also be used. In addition, the submount 140 may include a device such as a Zener diode to inhibit electrostatic discharge (ESD).

The first electrode 136A is connected to the first electrode pad 144A of the submount 140 via the first bump 146A, and the second electrode 136B is connected to the second electrode pad 144B of the submount 140 via the second bump 146B. The wires 170A and 170B serve to electrically connect the package body 110 and the light emitting device 130. Namely, the first electrode pad 144A is connected to a wire bonding region 116A of the first body 110A via the wire 170A, and the second electrode pad 144B is connected to a wire bonding region 116B of the second body 110B via the wire 170B.

Although not illustrated herein, a first upper bump metal layer (not shown) may further be disposed between the first electrode 136A and the first bump 146A, and a first lower bump metal layer (not shown) may further be disposed between the first electrode pad 144A and the first bump 146A. Here, the first upper bump metal layer and the first lower bump metal layer serve to indicate a position where the first bump 146A will be located. Similarly, a second upper bump metal layer (not shown) may further be disposed between the second electrode 136B and the second bump 146B, and a second lower bump metal layer (not shown) may further be disposed between the second electrode pad 144B and the second bump 146B. In this case, the second upper bump metal layer and the second lower bump metal layer serve to indicate a position where the second bump 146B will be located.

When the submount 140 is formed of Si, the passivation layer 142 may further be disposed between the submount 140 and the first and second electrodes pads 144A and 144B as illustrated in FIG. 5. Here, the passivation layer 142 may be formed of an insulating material.

Meanwhile, the molding member 150 is disposed on the light emitting device 130 to fill the cavity 112 of the package body 110. The molding member 150 surrounds the light emitting device 130 and the wires 170A and 170B bonded to the wire bonding regions 116A and 116B for protection. In addition, the molding member 150 includes a phosphor to change a wavelength of light emitted from the light emitting device 130.

Meanwhile, the package body 110 according to the illustrated embodiment may include at least one molding holding unit that is disposed on an upper portion than the lower surface of the cavity 112, is disposed adjacent to edges of the molding member 150, and holds the molding member 150. Here, holding of the molding member 150 refers to at least one of inhibiting the molding member 150 from horizontally spreading or improving a binding force between the molding member 150 and the package body 110. For example, the molding holding unit may have at least one first recess 114 formed at an upper portion 110B-1 of the package body 110. Hereinafter, the illustrated embodiment will be described based on that the molding holding unit includes the first recess 114, without being limited thereto. Namely, the molding holding unit may include a protrusion (not shown) disposed at the same position of the first recess 114 instead of the first recess 114.

At least one first recess 114 is disposed on an upper portion 110B-1 than the lower surface 112A of the cavity 112 in the package body 110 and disposed adjacent to an end of side 112B of the cavity 112.

Figure 6:
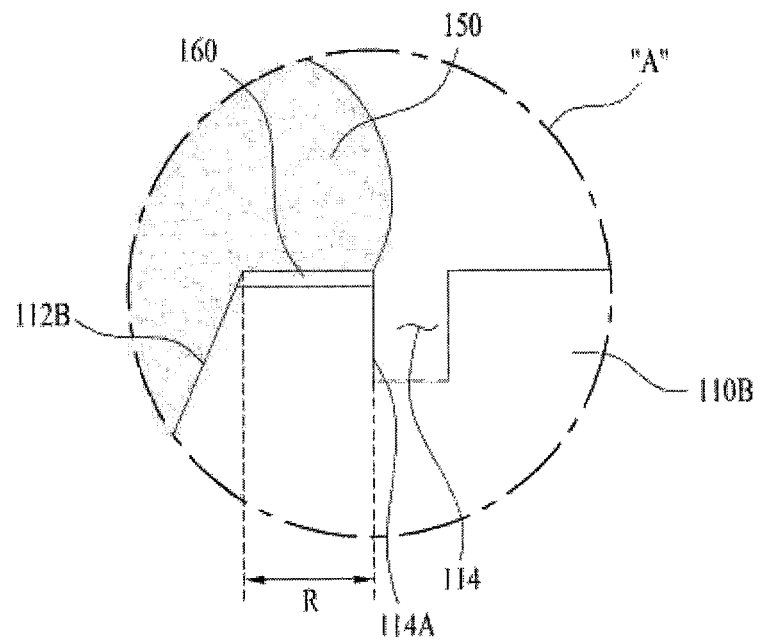
FIG. 6 is a partial cross-sectional view illustrating an enlarged portion A' of FIG. 4.

FIG. 6 is a partial cross-sectional view illustrating an enlarged portion A' of FIG. 4.

Referring to FIG. 6, the molding member 150 may be disposed extending to an inner edge 114A of the at least one first recess 114.

Figure 7A:
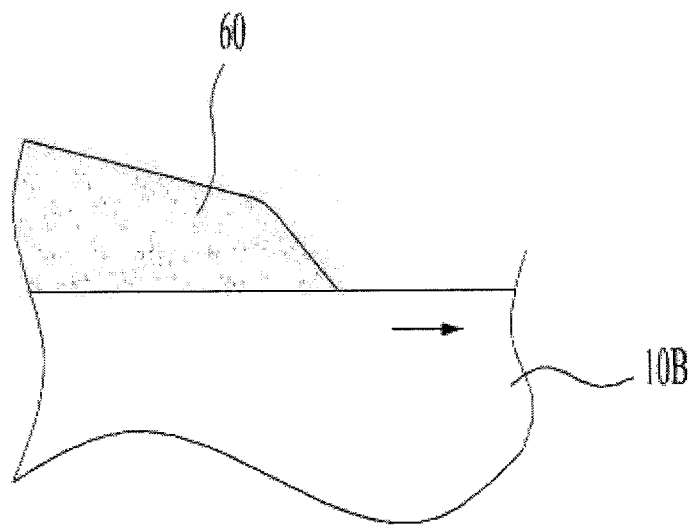
FIGS. 7A and 7B are diagrams for describing radius of curvature of a molding member.
Figure 7B:
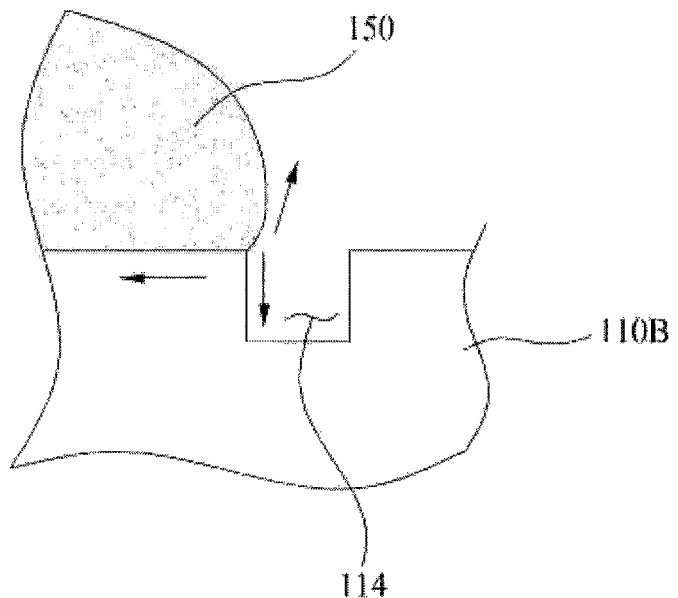
Figure 7B:
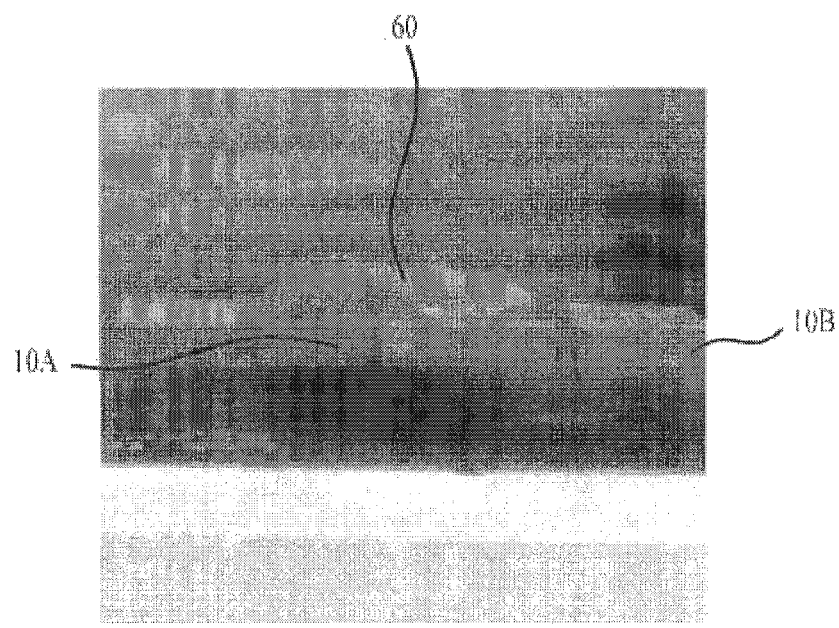

FIGS. 7A and 7B are diagrams for describing radius of curvature of the molding member 150.

When the light emitting device 130 emits light having a wavelength ranging from 200 nm to 405 nm, a gel-type molding member 150 having a lower viscosity than that of the molding member used in the light emitting device emitting blue light is used. For example, in case that the light emitting device 130 emit blue light, the molding member 150 has the viscosity ranging from 3,000 mPa·sec to 30,000 mPa·sec at a time when being filled in the cavity 112. In case that the light emitting device 130 emit light having the wavelength ranging from 200 nm to 405 nm, the molding member 150 may have the viscosity ranging from 0 to 3,000 mPa·sec at a time when being filled in the cavity 112.

In this case, as illustrated in FIG. 7A, the molding member 60 having the lower viscosity tends to spread in a direction designated by the arrow to be formed in a flat dome shape having a low height, not in a convex dome shape. As described above, as the radius of curvature of the molding member 150 increases, light extraction efficiency of the light emitting device package decreases.

In case that the light emitting device 30 emits light having a wavelength ranging from 430 nm to 485 nm, the molding member 60 has a first height h1 ranging from 0 to 0.1 D on the basis of the uppermost surface of the cavity in the conventional light emitting device packages as shown in FIG. 1. Here, 'D' means the width of the molding member 160 at the uppermost surface 110B-1 of the package body 110. Also, referring to FIG. 4, in case that the light emitting device 130 emits light having a wavelength ranging from 200 nm to 405 nm, the molding member 150 has a second height h2 ranging from 0.15 D to 0.35 D on the basis of the uppermost surface 110B-1 of the cavity 112. Thus, since the recess 114 is disposed in the embodiment, the second height h2 of the molding member 150 may increase by from 0.05 D to 0.35 D, in comparison to the first height h1. Namely, the difference between the second height h2 and the first height h1 may range from 0.05 D to 0.35 D.

The more the width w of the uppermost surface 110B-1 of the cavity 112 narrows, the more the second height h2 may increase. Here, if the width w is less than 1.0 mm, the light emitting device 130 may not be attached on the package body 110. Namely, the width w is more than or equal to 1.0 mm.

Therefore, according to the embodiment, the ratio h2/w of the second height h2 to the width w may range from 0.15 and 0.35 if the width w is almost equal to the D.

However, in the light emitting device package 100 according to the illustrated embodiment, at least one first recess 114 is disposed at the upper portion 110B-1 of the package body 110. Thus, the molding member 150 having a low viscosity may be formed in a hemispherical shape or a convex dome shape having a great height since horizontally spreading thereof is suppressed by surface tension shown in directions designated by the arrows, as illustrated in FIG. 7B.

In this regard, as illustrated in FIGS. 4 and 6, a coating layer 160 may further be disposed between the molding member 150 and the package body 110, on at least one portion of a region R between the edge of the cavity 112 and the inner edge 114A of the first recess 114. When the coating layer 160 is further disposed as described above, the height of the hemispherical shape of the molding member 150 may be further increased, in comparison with the case in which the coating layer 160 is not disposed. To this end, the coating layer 160 may be formed of a material having a low interfacial energy with the molding member 150. For example, the coating layer 160 may include at least one of an oxide such as $SiO_2$ or a polymer.

In case that the coating layer 160 is disposed, the second height h2 may increase by 0.35 D to 0.50 D.

Alternatively, differently from the structure illustrated in FIG. 6, the molding member 150 may be disposed to outer edges of the first recesses 114 while filling at least one of the first recesses 114. Accordingly, the binding force between the package body 110 and the molding member 150 may be increased.

Figure 8B:
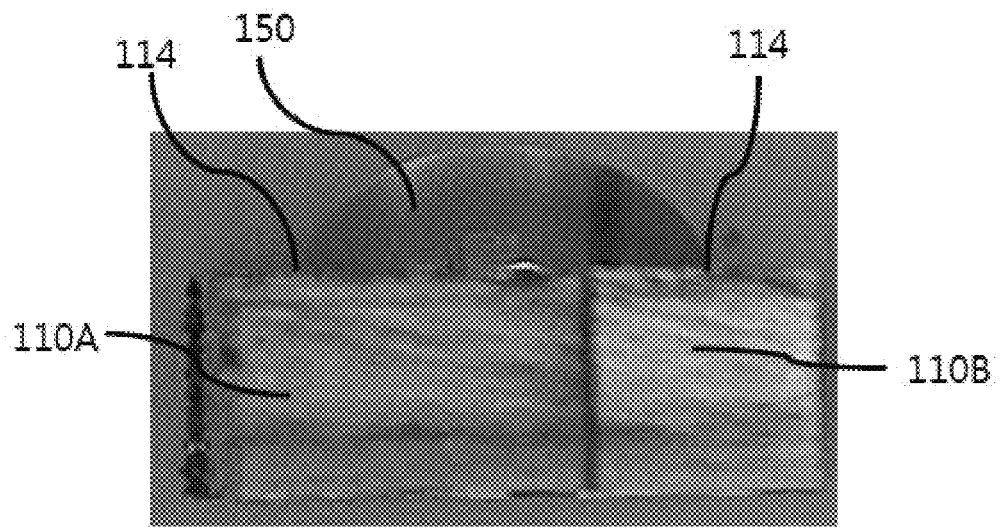

FIGS. 8A and 8B are photographs of cross-sections of a conventional light emitting device package and a light emitting device package 100 according to an embodiment of the present disclosure.

When the light emitting devices 30 and 130 emit DUV light, the radius of curvature of the molding member 150 of the light emitting device package 100 of FIG. 8B according to the illustrated embodiment is less than the radius of curvature of the molding member 60 of the conventional light emitting device package of FIG. 8A, so that the molding member 150 has a convex dome shape having a greater height than the molding member 60.

As described above, the radius of curvature of the molding member 150 of the light emitting device package 100 according to the illustrated embodiment may be decreased to 3.8 mm due to the at least one first recess 114 and the coating layer 160, so that light extraction efficiency thereof may be increased to be about 1.2 times that of the conventional light emitting device package.

In addition, according to the illustrated embodiment, the planar shape of the at least one first recess 114 may vary according to the planar shape of the cavity 112. For example, the planar shape of the first recess 114 may be the same as that of the cavity 112. For example, when the cavity 112 has a circular planar shape as illustrated in FIGS. 2 and 3, the first recess 114 may also have a circular planar shape surrounding the cavity 112. However, embodiments of the present disclosure are not limited thereto.

Meanwhile, as described above, aluminum (Al) may be used to form the package body 110 in order to reflect light emitted from the light emitting device 130 upward. In this case, difference in coefficient of thermal expansion between the package body 110 formed of aluminum (Al) and the submount 40 may cause poor contact. In order to improve contact properties thereof, the package body 110 may further include at least one second recess 118 as illustrated in FIGS. 3 and 4.

The at least one second recess 118 is disposed at an upper portion of the package body 110, on which the light emitting device 130 is mounted, and contacted the submount 140 in the cavity 112. Width, depth, and the number of the second recess 118 are described below according to the illustrated embodiment.

Figure 9:
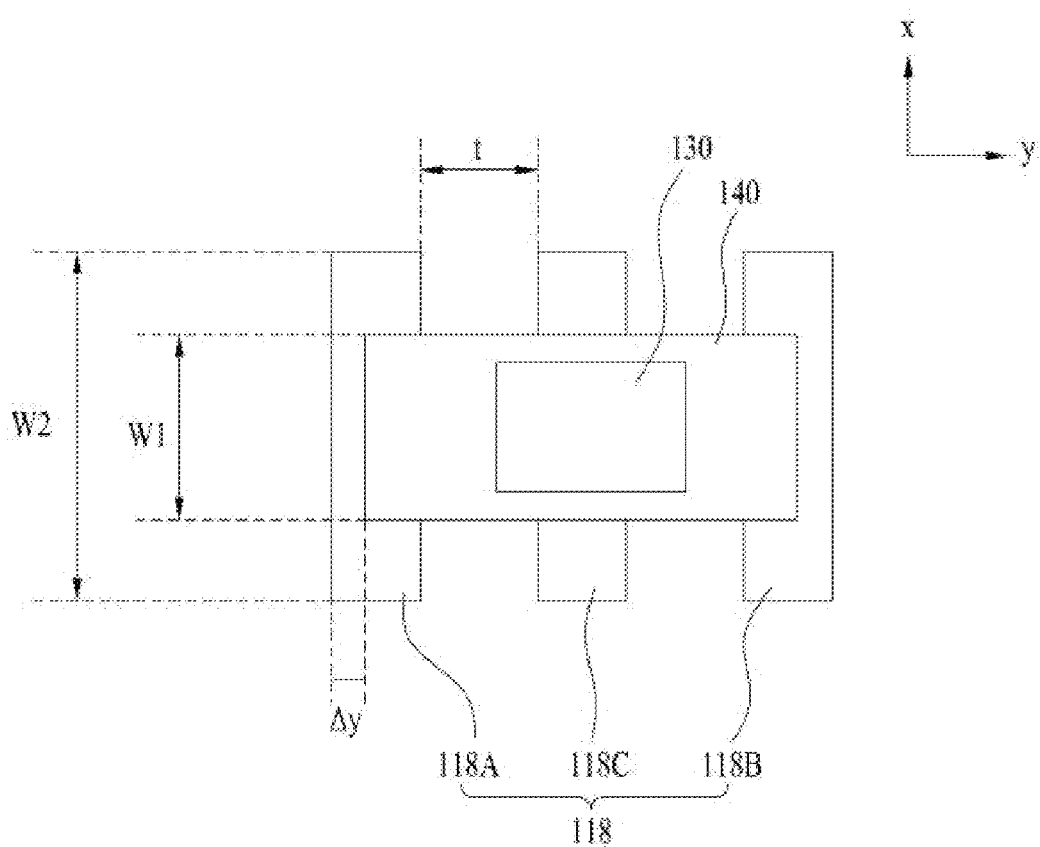
FIG. 9 is a plan view illustrating an enlarged portion 'B' of FIG. 3.

FIG. 9 is a plan view illustrating an enlarged portion 'B' of FIG. 3.

Referring to FIG. 9, the at least one second recess 118 may have a width W2 greater than a width W1 of the short axis, i.e., X-axis, of the submount 140, and a plurality of second recesses 118A, 118B, and 118C may be aligned in the long axis, i.e., Y-axis, of the submount 140.

In addition, the depth d of the second recess 118 may satisfy Equation 1 below.

Equation 1

$$t < d < 5t$$

In Equation 1, t is an interval between the plurality of second recesses 118A, 118B, and 118C, i.e., a distance between the second recesses 118A, 118B, and 118C spaced apart from each other.

When the depth d of the second recess 118 is t or less, stress caused by the difference of coefficient of thermal expansion between the submount 140 and the package body 110 may not be buffered. On the other hand, when the depth d of the second recess 118 is 5 t or greater, heat transfer may be deteriorated. Accordingly, the depth d of the second recess 118 may satisfy Equation 1.

In addition, among the second recesses 118A, 118B, and 118C, the second recesses 118A and 118C disposed at outer edges of the long axis (Y-axis) of the submount 140 may be formed to protrude farther from the submount 140 in the long-axial (Y-axial) direction. Namely, Δy may be greater than 0.

Although FIG. 9 illustrates three second recesses 118A, 118B, and 118C, the number of the second recesses is not limited thereto. Namely, the number of the second recesses may be greater than or less than three. In addition, referring to FIGS. 3, 4, and 9, the plurality of second recesses 118A, 118B, and 118C have the same depth d and the same width W2. However, the illustrated embodiment is not limited thereto. The plurality of second recess 118A, 118B, and 118C may also have different depths d and different widths W2.

The second recesses 118A, 118B, and 118C may be at least partially filled with air. However, the molding member 150 may enter the second recesses 118A, 118B, and 118C when the cavity 112 is filled with the molding member 150 so that the molding member 150 may be in the second recesses 118A, 118B, and/or 118C.

Since at least one second recess 118 is disposed at the package body 110 to contact the submount 140 as described above, the difference in coefficient of thermal expansion between the submount 140 and the package body 110 may be reduced. Thus, tensile stress in the X-axial and Y-axial directions is reduced, so that contact properties may be improved, thereby improving reliability of the light emitting device package 100.

Meanwhile, the package body 110 formed of aluminum (Al) and the wires 170A and 170B formed of gold (Au) are bonded to each other in a relatively weak bonding force. In order to improve the bonding force, the wire bonding regions 116A and 116B of package body 110 bonded to the wires 170A and 170B illustrated in FIGS. 2 to 5 may have a surface roughness according to the illustrated embodiment. On the other hand, the other regions in the cavity 112 except for the wire bonding regions 116A and 116B may have a mirror-like surface without the roughness to improve internal reflectivity. For example, the wire bonding regions 116A and 116B may have an average surface roughness (Ra) of greater than 1.6 μm and less than 25 μm, and the other regions in the cavity 112 except for the wire bonding regions 116A and 116B may have an average surface roughness of 1.6 μm or less.

Figure 10:
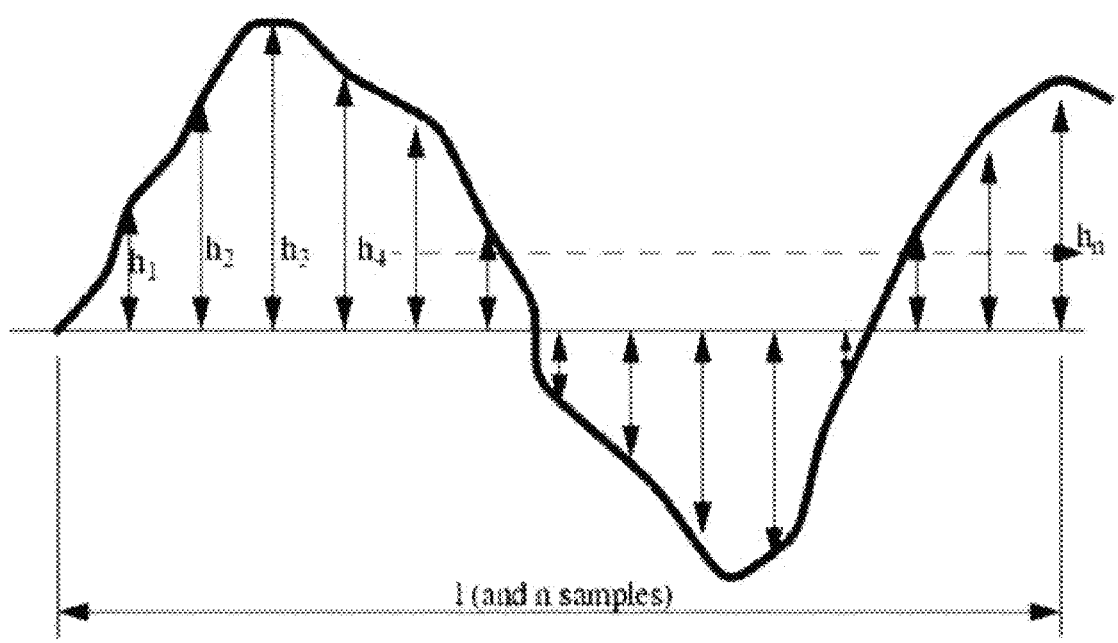
FIG. 10 is a diagram for describing average surface roughness.

FIG. 10 is a diagram for describing average surface roughness (Ra).

Referring to FIG. 10, the average surface roughness refers to an arithmetic average of absolute values of differences between the average surface height and each surface height, and may satisfy Equation 2 below.

$$R_a = \sum \frac{h}{n} = \frac{h_1 + h_2 + \ldots + h_n}{l} \qquad \text{Equation 2}$$

As described above, due to roughness of the wire bonding regions 116A and 116B according to the illustrated embodiment, the bonding force between the package body 110 formed of aluminum (Al) and the wires 170A and 170B formed of gold (Au) may be improved.

According to another embodiment, a plurality of the light emitting device packages may be arrayed on a substrate. Optical members, namely, light guide plates, prismatic sheets, diffusion sheets, fluorescent sheets, and the like may be arranged on optical paths of the light emitting device packages. Such light emitting device packages, substrates, and optical members may function as a sterilizer, a backlight unit or a lighting unit. For example, a lighting system may include a backlight unit, a lighting unit, an indication apparatus, a lamp, a street lamp, and the like.

Figure 11:
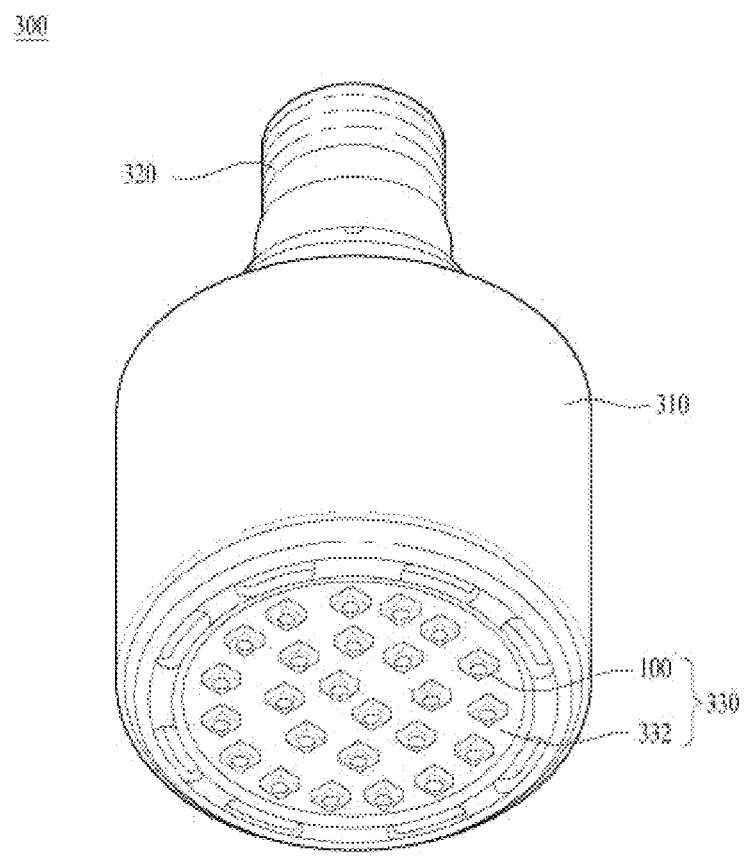
FIG. 11 is a perspective view illustrating a lighting unit according to an embodiment of the present disclosure.

FIG. 11 is a perspective view illustrating a lighting unit 300 according to an embodiment of the present disclosure. The lighting unit 300 of FIG. 11 is an example of the lighting system, and the present disclosure is not limited thereto.

According to the illustrated embodiment, the lighting unit 300 may include a case body 310, a connection terminal 320 mounted on the case body 310 and receiving power from an external power supply, and a light emitting module 330 mounted on the case body 310.

The case body 310 may be formed of a material having high heat dissipation, such as metal or resin.

The light emitting module 330 may include a substrate 332 and at least one light emitting device package 100 mounted on the substrate 332. In this regard, the light emitting device package 100 is the light emitting device package illustrated in FIGS. 2 to 5 and may be described using the same reference numerals.

The substrate 332 may be an insulating material-based substrate on which a circuit pattern is printed, for example, a general printed circuit board (PCB), a metal core PCB, a flexible PCB, a ceramic PCB, or the like.

Furthermore, the substrate 332 may be formed of a material efficiently reflecting light or may have a surface with a color efficiently reflecting light, such as white, silver, or the like.

At least one light emitting device package 100 may be mounted on the substrate 332. Each of the light emitting device packages 100 may include at least one light emitting device 130 such as a light emitting diode (LED). The LED may include a color LED that emits colored light, such as red light, green light, blue light, or white light, and an ultraviolet (UV), particularly, deep ultraviolet (DUV), LED emitting UV light, particularly DUV light.

The light emitting module 330 may include a combination of various light emitting device packages 100 to obtain desired color and brightness. For example, for the purpose of securing color rendering index (CRI), a white LED, a red LED, and a green LED may be arranged in combination.

The connection terminal 320 may be electrically connected to the light emitting module 330 to supply power thereto. According to the illustrated embodiment, the connection terminal 320 is coupled to the external power supply in the same manner as a socket is fastened, but the present disclosure is not limited thereto. For example, the connection terminal 320 may have a pin shape so as to be inserted into the external power supply or may be connected to the external power supply via electrical wiring.

Figure 12:
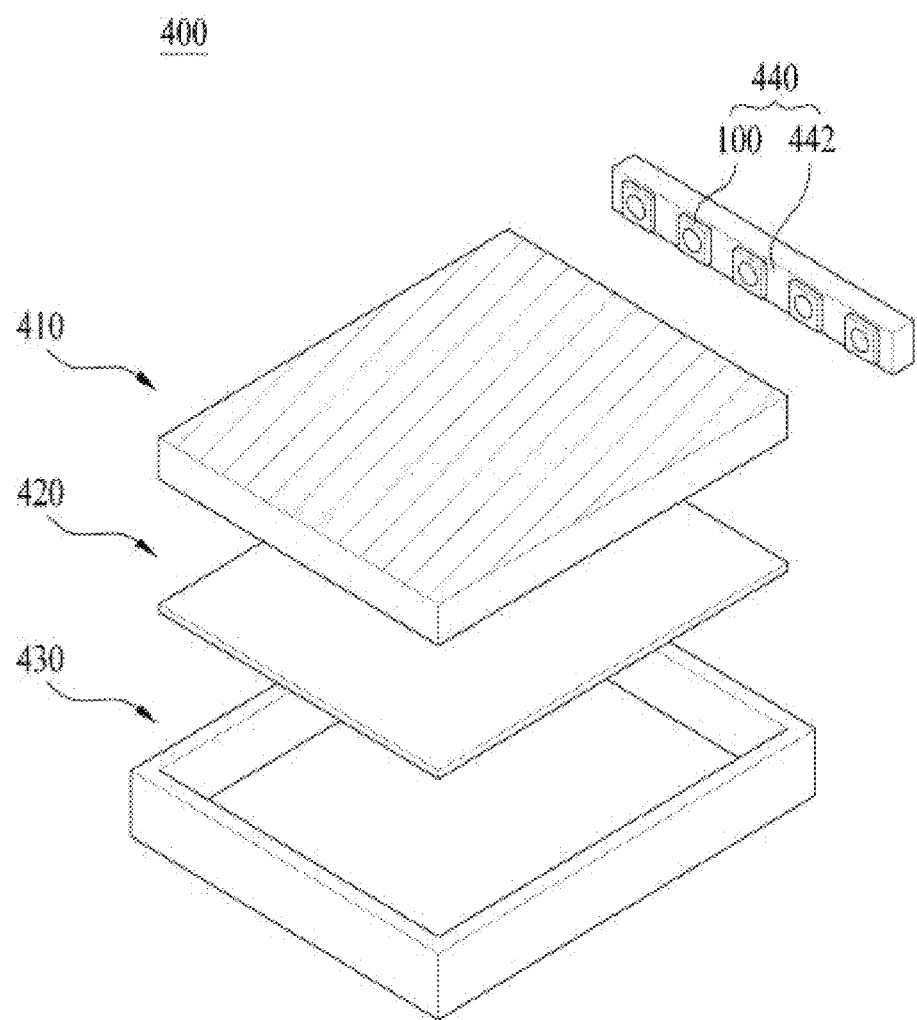
FIG. 12 is an exploded perspective view illustrating a backlight unit according to an embodiment of the present disclosure.

FIG. 12 is an exploded perspective view illustrating a backlight unit 400 according to an embodiment of the present disclosure. The backlight unit 400 of FIG. 12 is an example of the lighting system, without being limited thereto.

The backlight unit 400 according to the illustrated embodiment includes a light guide plate 410, a reflection member 420 disposed under the light guide plate 410, a bottom cover 430, and a light emitting module 440 providing light to the light guide plate 410. The bottom cover 430 accommodates the light guide plate 410, the reflection member 420, and the light emitting module 440.

The light guide plate 410 diffuses light to change the light source into a surface light source. The light guide plate 410 is formed of a transparent material and may include at least one resin selected from the group consisting of an acrylic resin such as polymethyl methacrylate (PMMA), polyethylene terephthalate (PET), polycarbonate (PC), cycloolefin copolymer (COC), polyethylene naphthalate (PEN) and combinations thereof.

The light emitting module 440 provides light to at least one side surface of the light guide plate 410 and functions as a light source of a display device provided with the backlight unit.

The light emitting module 440 may contact the light guide plate 410, but the present disclosure is not limited thereto. Particularly, the light emitting module 440 includes a substrate 442 and a plurality of light emitting device packages 100 mounted on the substrate 442. In this regard, the light emitting device package is the same as the light emitting device package 100 illustrated in FIGS. 2 to 4 and may be described using the same reference numerals.

The substrate 442 may contact the light guide plate 410, without being limited thereto. The substrate 442 may be a PCB having a circuit pattern (not shown). The substrate 442 may also be a metal core PCB (MCPCB), and a flexible PCB, in addition to general PCBs, without being limited thereto.

The light emitting device packages 100 may be mounted on the substrate 442 such that a light emitting plane is spaced apart from the light guide plate 410 by a predetermined distance.

The reflection member 420 may be formed under the light guide plate 410. The reflection member 420 reflects light incident from the bottom surface of the light guide plate 410 upward, thereby improving brightness of the backlight unit 400. The reflection member 420 may be formed of, for example, PET, PC, PVC resin, or the like, without being limited thereto.

The bottom cover 430 may accommodate the light guide plate 410, the light emitting module 440, and the reflection member 420. To this end, the bottom cover 430 may have a box shape having an open upper surface, without being limited thereto.

The bottom cover 430 may be formed of a metal or resin and may be manufactured by press molding or extrusion molding.

According to another embodiment of the present disclosure, when the light emitting device of the light emitting device package emits DUV light, the aforementioned light emitting device package 100 may be applied to a variety of sterilizers.

Figure 13:
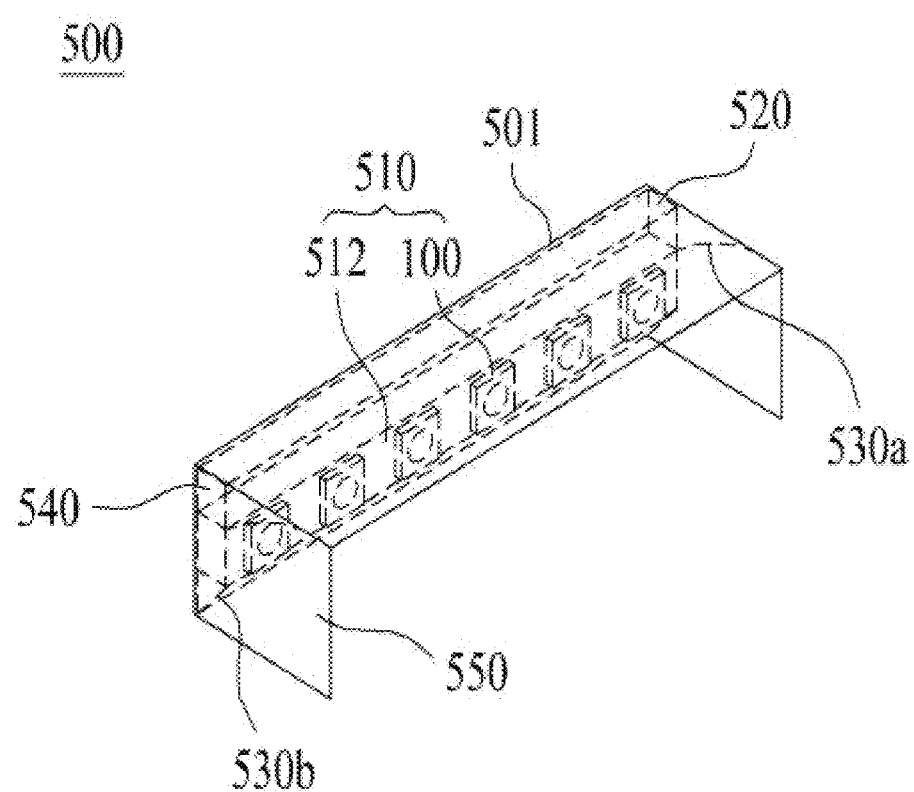
FIG. 13 is a perspective view illustrating an air sterilizer according to an embodiment of the present disclosure.

FIG. 13 is a perspective view illustrating an air sterilizer 500 according to an embodiment of the present disclosure.

Referring to FIG. 13, the air sterilizer 500 includes a light emitting module 510 mounted on one surface of a casing 501, diffuse reflection members 530a and 530b to diffusively reflect emitted DUV light, and a power supply 520 that supplies power required by the light emitting module 510.

First, the casing 501 may have a rectangular structure in which the light emitting module 510, the diffuse reflection members 530a and 530b, and the power supply 520 are integrally mounted, i.e., mounted in a compact structure. In addition, the casing 501 may be formed of a material and have a shape, for efficiently discharging heat generated by the sterilizer 500. For example, the material used to form the casing 501 may include at least one selected from the group consisting of Al, Cu, and any alloy thereof. Thus, the casing 501 may have improved heat transfer efficiency to the outside, thereby exhibiting improved heat dissipation.

Alternatively, the casing 501 may have a particular external surface shape. For example, the casing 501 may have an external surface shape such as a corrugated shape, a mesh shape, or an irregular uneven pattern. Thus, heat may be more efficiently transferred from the casing 501 to the outside, thereby improving heat dissipation.

Meanwhile, attachment plates 550 may further be disposed at both ends of the casing 501. The attachment plates 550 refer to brackets used to fix the casing 501 to the device as illustrated in FIG. 13. The attachment plates 550 may protrude from both ends of the casing 501 in a predetermined direction. In this regard, the predetermined direction is an inward direction of the casing 501 where DUV light is emitted and diffuse reflection occurs.

Thus, the attachment plates 550 disposed at both ends of the casing 501 provide fixing regions to the device to allow the casing 501 to be more efficiently fixed thereto.

The attachment plate 550 may have at least one shape selected from the group consisting of a screw coupling unit, a rivet coupling unit, an adhesive unit, and a detaching unit. In this regard, these various coupling units will be apparent to those skilled in the art, and thus a detailed description thereof will not be given herein.

Meanwhile, the light emitting module 510 is mounted on one surface of the casing 501. The light emitting module 510 emits DUV light to kill microorganisms in the air. To this end, the light emitting module 510 includes a substrate 512 and a plurality of light emitting device packages 100 mounted on the substrate 512. In this regard, each light emitting device package 100 corresponds to the light emitting device package 100 illustrated in FIGS. 2 to 4. Thus, each light emitting device package is designated by the same reference numerals.

The substrate 512 may be a PCB including a circuit pattern (not shown) aligned in a single column along an inner surface of the casing 501. The substrate 512 may also be a metal core PCB (MCPCB) or a flexible PCB in addition to general PCBs, but the present disclosure is not limited thereto.

The diffuse reflection members 530*a* and 530*b* refer to members having a reflection plate to cause diffuse reflection of DUV light emitted from the aforementioned light emitting module 510. The diffuse reflection members 530*a* and 530*b* may have various front shapes and may be aligned in various forms. By slightly modifying a planar structure, for example, radius of curvature, of the diffuse reflection members 530*a* and 530*b*, the diffuse reflected DUV light may overlap each other while being emitted so that emission intensity may be improved or a region exposed to the DUV light may have an enlarged width.

The power supply 520 receives power and supplies available power required by the light emitting module 510. The power supply 520 may be disposed in the casing 501. As illustrated in FIG. 13, the power supply 520 may be disposed at an inner wall of a space between the light emitting module 510 and each of the diffuse reflection members 530*a* and 530*b*. A power connector 540 to introduce external power to the power supply 520 may further be disposed.

As illustrated in FIG. 13, the power connector 540 may have a planar shape or may have a shape of a socket or a cable slot to which an external power cable (not shown) may be electrically connected. In addition, the power cable has a flexible extension structure so as to be efficiently connected to an external power supply.

The light emitting device package according to the illustrated embodiment may have about 1.2 times improved light extraction efficiency, upon comparison with conventional light emitting device packages, due to the at least one first recess and the coating layer which reduce the radius of curvature of the molding member. The light emitting device package according to the illustrated embodiment may have improved contact properties by reducing difference in coefficient of thermal expansion between package body and the submount by disposing at least one second recess at the package body to contact the submount, thereby improving product reliability. Furthermore, since the wire bonding region is rough, the bonding force between the package body formed of aluminum (Al) and wires formed of gold (Au) may be improved.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package, comprising:
   a package body having first and second surfaces, the first and second surfaces being opposite surfaces, and at least one cavity provided on the first surface;
   at least one light emitting device provided in the cavity;
   a submount provided between the light emitting device and to the package body;
   a molding member provided over the cavity, and
   at least two recesses provided at a bottom of the cavity, wherein at Least one first groove is provided adjacent to the cavity, wherein the first groove has a height lower than a height of the cavity, wherein the first groove defines a boundary of the molding member on the first surface of the package body, and wherein the at least two recesses include:
   first recesses disposed only at outer edges of a long avis of the submount, protruding from the outer edges of the long axis of the submount in a long axis direction, without vertically overlapping the at least one light emitting device in a thickness direction of the at least one emitting device; and
   at least one second recess disposed between the first recesses in the long axis direction of the submount, vertically overlapping the at least one light emitting device in the thickness direction of the at least one light emitting device, and not disposed at the outer edges of the long axis.

2. The light emitting device package according to claim 1, wherein a shape of the first groove is the same as a shape of the cavity.

3. The light emitting device package according to claim l, wherein the submount has a width in a first direction and a length in a second direction of the long axis direction, and the at least two recesses have a width greater than the width of the submount in the first direction and comprises a plurality of recesses aligned in the second direction.

4. The light emitting device package according to claim 3, wherein the at least two recesses have a depth of $$t<d<5t$$

where d is a depth of the at least two recesses in a third direction of the thickness direction of the at least one light emitting device and t is an interval between the plurality of recesses in the second direction.

5. The light emitting device package according to claim 1, wherein the at least two recesses have same length and width.

6. The light emitting device package according to claim 1, wherein the at least two recesses have different lengths and widths.

7. The light emitting device package according to claim 1, wherein air is provided inside of the at least two recesses.

8. The light emitting device package according to claim 1, wherein the molding member is provided inside of the at least two recesses.

9. The light emitting device package according to claim 1, further comprising a wire electrically connecting the package body and the light emitting device, wherein the package body has a wire bonding region, to which the wire is bonded, having a rough surface.

10. The light emitting device package according to claim 9, wherein the wire bonding region has an average surface roughness range of greater than 1.6 μm and less than 25 μm.

11. The light emitting device package according to claim 9, wherein the package body comprises aluminum (Al), and the wire comprises gold (Au).

12. A light emitting package comprising:
- a package body having a first surface and a second surface, the first and second surface being opposite surfaces separated by a first height;
- a cavity provided on the first surface of the package body and having a second height less than the first height, the cavity having a first width at the top of the cavity and a second width at a bottom of the cavity;
- at least one light emitting device provided in the cavity;
- a molding member provided in the cavity and having a concave shape, wherein a third height from the first surface of the package body to a peak of the concave shape is 0:15 to 0.35 of the first width;
- a submount provided on a third surface at the bottom of the cavity; and
- at least two recesses provided in the third surface at the bottom of the cavity, wherein the at least two recesses include:
    - first recesses disposed only at outer edges of a long axis of the submount, protruding from the outer edges of the long axis of the submount in a long axis direction, without vertically overlapping the at least one light emitting device in a thickness direction of the at least one light emitting device; and
    - at least one second recess disposed between the first recesses in the long axis direction of the submount, vertically overlapping the at least one light emitting device in a thickness direction of the at least one light emitting device, and not disposed at the outer edges of the long axis.

13. The light emitting pack-age of claim 12, wherein the molding member has a viscosity of less than 3,000 mPa*sec in liquid form prior to hardening.

14. The light emitting package of claim 12, further comprising a groove on the first surface having a fourth height less than the second height, and wherein the groove has a width greater than the first width such that the groove surrounds the cavity and the width of the groove is smaller than a width of the package body.

* * * * *